(12) United States Patent

Carrigan

(10) Patent No.: US 12,631,803 B2

(45) Date of Patent: May 19, 2026

(54) LIGHTWEIGHT, HIGH-PRECISION SILICON CARBIDE AEROSPACE MIRROR

(71) Applicant: Raytheon Company, Waltham, MA (US)

(72) Inventor: Keith Carrigan, Playa Vista, CA (US)

(73) Assignee: RAYTHEON COMPANY, Waltham, MA (US)

( * ) Notice: Subject to any disclaimer, the term of this patent is extended or adjusted under 35 U.S.C. 154(b) by 93 days.

(21) Appl. No.: 18/118,087

(22) Filed: Mar. 6, 2023

(65) Prior Publication Data

US 2023/0228922 A1      Jul. 20, 2023

Related U.S. Application Data

(62) Division of application No. 17/741,329, filed on May 10, 2022, which is a division of application No.
(Continued)

(51) Int. Cl.
G02B 5/08          (2006.01)
C23C 16/02          (2006.01)
(Continued)

(52) U.S. Cl.
CPC ........ G02B 5/0808 (2013.01); C23C 16/0254 (2013.01); C23C 16/325 (2013.01);
(Continued)

(58) Field of Classification Search
CPC ........ G02B 5/0808; G02B 5/10; G02B 7/183; G02B 7/198; G02B 1/10; C23C 16/0254; C23C 16/325; B64G 1/10
(Continued)

(56) References Cited

U.S. PATENT DOCUMENTS 2,464,141 A      3/1949  Maier
3,914,063 A      10/1975  Papayoti
(Continued)

FOREIGN PATENT DOCUMENTS

CN      101470223 B      10/2012
CN      104451580 A      3/2015
(Continued)

OTHER PUBLICATIONS

Li et al; Optimal design of a φ 760 mm lightweight SiC mirror and the flexural mount for a space telescope; Dec. 11, 2017; Rev. Sci. Instrum. 88. (Year: 2017).*
(Continued)

*Primary Examiner* — Ricky D Shafer
(74) *Attorney, Agent, or Firm* — CANTOR COLBURN LLP

(57)          ABSTRACT

An aerospace mirror having a reaction bonded (RB) silicon carbide (SiC) mirror substrate, and a SiC cladding on the RB SiC mirror substrate forming an optical surface on a front side of the aerospace mirror. A method for manufacturing an aerospace mirror comprising obtaining a green mirror preform comprising porous carbon, silicon carbide (SiC), or both, the green mirror preform defining a front side of the aerospace mirror and a back side of the aerospace mirror opposite the front side; removing material from the green mirror preform to form support ribs on the back side; infiltrating the green mirror preform with silicon to create a reaction bonded (RB) SiC mirror substrate from the green mirror preform; forming a mounting interface surface on the back side of the aerospace mirror from the RB SiC mirror substrate, and forming a reflector surface of the RB SiC mirror substrate on the front side of the aerospace mirror. Additionally, the method can comprise cladding the reflector
(Continued)

surface of the RB SiC mirror substrate with SiC to form an optical surface of the aerospace mirror.

8 Claims, 7 Drawing Sheets

Related U.S. Application Data

15/993,513, filed on May 30, 2018, now Pat. No. 11,327,208.

(51) Int. Cl.

| | |
|---|---|
| *C23C 16/32* | (2006.01) |
| *G02B 5/10* | (2006.01) |
| *G02B 7/183* | (2021.01) |
| *G02B 7/198* | (2021.01) |
| *B64G 1/10* | (2006.01) |
| *G02B 1/10* | (2015.01) |

(52) U.S. Cl.

CPC ............... *G02B 5/10* (2013.01); *G02B 7/183* (2013.01); *G02B 7/198* (2013.01); *B64G 1/10* (2013.01); *G02B 1/10* (2013.01)

(58) Field of Classification Search

USPC ................................................. 359/849, 871

See application file for complete search history.

(56) References Cited

U.S. PATENT DOCUMENTS

| | | | |
|---|---|---|---|
| 4,074,416 | A | 2/1978 | Rambauske et al. |
| 4,285,728 | A | 8/1981 | Babcock et al. |
| 4,286,581 | A | 9/1981 | Atkinson, Jr. |
| 4,451,119 | A | 5/1984 | Meyers et al. |
| 4,655,563 | A | 4/1987 | Plante et al. |
| 4,763,991 | A | 8/1988 | Klotz, Jr. |
| 4,856,887 | A | 8/1989 | Wakugawa et al. |
| 5,071,596 | A | 12/1991 | Goela et al. |
| 5,076,700 | A | 12/1991 | DeCaprio |
| 5,302,561 | A | 4/1994 | Ezis |
| 5,358,685 | A | 10/1994 | Ezis |
| 5,461,515 | A | 10/1995 | Sorce |
| 5,642,237 | A | 6/1997 | Miyawaki et al. |
| 5,643,514 | A | 7/1997 | Chwastiak et al. |
| 5,741,445 | A | 4/1998 | Taylor et al. |
| 5,760,979 | A | 6/1998 | Saito |
| 5,825,565 | A | 10/1998 | Papenburg et al. |
| 6,176,588 | B1 | 1/2001 | Davis, Jr. et al. |
| 6,402,329 | B1 | 6/2002 | Bailly et al. |
| 6,519,084 | B1 | 2/2003 | Kawasaki |
| 6,765,712 | B2 | 7/2004 | Van Dijsseldonk et al. |
| 6,840,638 | B2 | 1/2005 | Watson |
| 7,080,915 | B2 | 7/2006 | Tsuno et al. |
| 7,195,361 | B2 | 3/2007 | Ealey |
| 7,244,034 | B1 | 7/2007 | Karandikar et al. |
| 8,139,298 | B2 | 3/2012 | Martin et al. |
| 8,292,537 | B2 | 10/2012 | Newswander |
| 8,607,513 | B2 | 12/2013 | Anderson |
| 8,911,098 | B2 | 12/2014 | Schaeffer et al. |
| 9,575,223 | B2 | 2/2017 | Schaefer et al. |
| 9,791,662 | B2 | 10/2017 | Baldus et al. |
| 10,877,237 | B2 | 12/2020 | Carrigan et al. |
| 11,314,041 | B2 | 4/2022 | Carrigan et al. |
| 11,327,208 | B2 | 5/2022 | Carrigan |
| 12,044,867 | B2 * | 7/2024 | Carrigan ............... C23C 16/325 |
| 2003/0026534 | A1 | 2/2003 | Skull et al. |
| 2003/0117730 | A1 | 6/2003 | Kroedel et al. |
| 2005/0046979 | A1 | 3/2005 | Hiley et al. |
| 2005/0141108 | A1 | 6/2005 | Atkinson et al. |
| 2007/0207268 | A1 | 9/2007 | Webb et al. |
| 2011/0221084 | A1 | 9/2011 | Goodman et al. |
| 2012/0287520 | A1 | 11/2012 | Schaefer et al. |
| 2013/0293975 | A1 | 11/2013 | Englander et al. |
| 2014/0078513 | A1 | 3/2014 | Freimann et al. |
| 2015/0077874 | A1 | 3/2015 | Naepflin et al. |
| 2017/0055731 | A1 | 3/2017 | Bullard et al. |
| 2017/0090178 | A1 | 3/2017 | Bullard et al. |
| 2019/0162931 | A1 * | 5/2019 | Carrigan .............. G02B 17/061 |

FOREIGN PATENT DOCUMENTS

| | | |
|---|---|---|
| EP | 0794442 A1 | 9/1997 |
| JP | H03-163501 A | 7/1991 |
| JP | 2009-276378 A | 11/2009 |
| JP | 2010-152090 A | 7/2010 |
| JP | 2010-262163 A | 11/2010 |
| KR | 10-1688426 | 1/2017 |

OTHER PUBLICATIONS

Black, Harris Corp., Rochester, NY, US, https://www.compositesworld.com/articles/harris-corp-rochester-ny-us, Feb. 26, 2016, 7 pages, CompositesWorld, Cincinnati, OH.

European Space Agency, Herschel Primary Mirror Fabrication, http://sci.esa.int/herschel/34705-herschel-primary-mirror-fabrication/, Mar. 18, 2004, 2 pages, European Space Agency, France.

Lei et al., Athermalization of Coaxial Reflective Space Telescope, Proceedings of SPIE, Oct. 13, 2010, vol. 4654, 5 pages, SPIE, Bellingham, Washington.

Matthews, HDST Mirror Technology Assessment, https://asd.gsfc.nasa.gov/conferences/uvvis/flagship/UVVis_Flagship_Matthews.pdf, to the best of the applicant's knowledge article was available before the application filing date, 15 pages.

Johnson, Sic coatings on RB SiC mirrors for ultrasmooth surfaces, SPIE.Digital Library, Dec. 6, 1993, 2 pages, SPIE, Bellingham, WA.

Machado et al., Picometer resolution interferometric characterization of the dimensional stability of zero CTE CFRP, Proceedings of SPIE, Jul. 23, 2008, vol. 7018, 12 pages, SPIE, Bellingham, Washington.

Robichaud et al., Silicon Carbide Optics for Space Situational Awareness and Responsive Space Needs, Proceedings of the Advanced Maui Optical and Space Surveillance Technologies Conference, 2008, 5 pages, L-3 Communications, SSG—Tinsley, Inc., Wilmington, MA.

Romeo et al., Final assembly of the ULTRA 1-m carbon fiber optical telescope, Proceedings of SPIE, Sep. 17, 2007, vol. 6665, 10 pages, SPIE, Bellingham, Washington.

Wang et al., Surface modification on silicon carbide mirror for space application, Key Laboratory of Optical System Advanced Manufacturing Technology, Apr. 30, 2010, vol. 8, Supplement, Chinese Optics Letters, China.

West et al., Wavefront control of the Large Optics Test and Integration Site (LOTIS) 6.5 m Collimator, Applied Optics, Jun. 20, 2010, vol. 49, No. 18, 16 pages, The Optical Society, Washington, DC.

Invitation to Pay Additional Fees for International Application No. PCT/US2018/053600 dated Jan. 23, 2019, 17 pages.

International Search Report for International Application No. PCT/US2018/053600 dated Apr. 11, 2019, 22 pages.

International Search Report for International Application No. PCT/US2019/023936 dated Jun. 3, 2019, 13 pages.

* cited by examiner

A-A

B-B

Assembling the aerospace mirror to a test support base using a test mounting structure that is the same as, or equivalent to, the final installation mounting structure. ~330

Measuring the optical surface. ~331

Machining the optical surface. ~332

C-C

LIGHTWEIGHT, HIGH-PRECISION SILICON CARBIDE AEROSPACE MIRROR

RELATED APPLICATIONS

This is a divisional application of U.S. application Ser. No. 17/741,329, filed May 10, 2022, entitled "Method of Manufacture for a Lightweight, High-Precision Silicon Carbide Mirror Assembly," which is a divisional application of U.S. application Ser. No. 15/993,513, filed May 30, 2018, entitled "Method of Manufacture for a Lightweight, High-Precision Silicon Carbide Mirror Assembly", each of which is incorporated by reference in its entirety herein.

BACKGROUND

Space-based imaging systems (e.g., in telescopes commonly found on satellites) are often configured as reflector-type imaging systems. Such imaging systems require large primary mirrors (i.e., mirror diameter greater than ~0.5 meter) with large apertures to achieve a desired resolution and/or signal-to-noise ratio (SNR). Spaced-based imaging systems are susceptible to environmental (e.g., temperature) variations that can reduce image quality. Mirrors used in such imaging systems are therefore designed to reduce sensitivity to environmental variation. In addition, surface distortion of a mirror's optical surface, or "figure error," is typically held to very tight tolerances (e.g., a fraction of a millionth of an inch). The larger the mirror the more difficult it is to avoid distortion and meet the tolerance requirements. Materials and designs for high-precision, space-based optical applications are characterized by a low coefficient of thermal expansion (CTE), light weight, and high stiffness in order to meet design requirements. One typical mirror design utilizes near-zero CTE material for optics (e.g., ultra-low expansion (ULE) glass mirrors) in the system. Silicon carbide (SiC) is also an emerging material for use in high-precision optics.

BRIEF DESCRIPTION OF THE DRAWINGS

Features and advantages of the invention will be apparent from the detailed description which follows, taken in conjunction with the accompanying drawings, which together illustrate, by way of example, features of the invention; and, wherein.

Figure 1A:
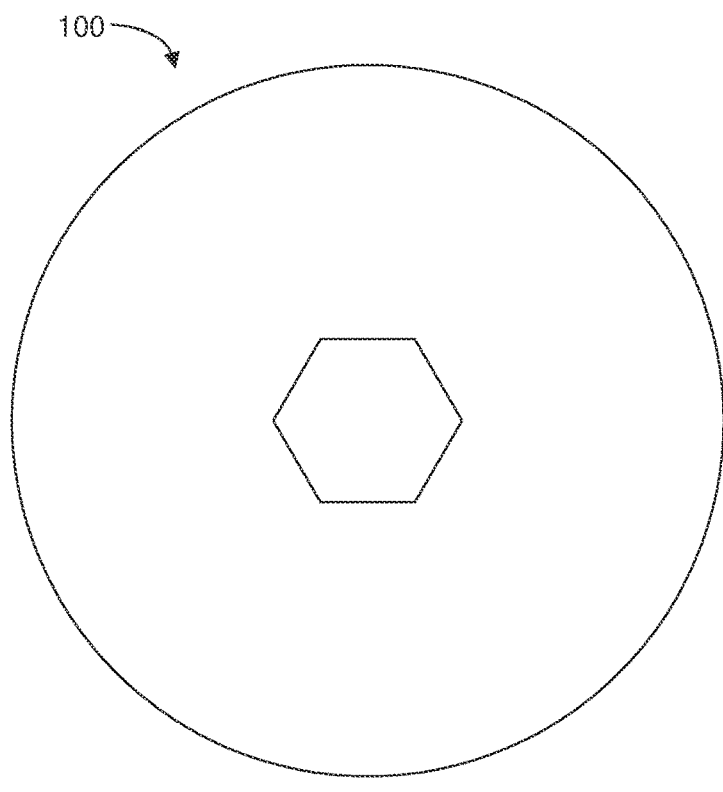
FIG. 1A illustrates a front view of an aerospace mirror in accordance with an example of the present disclosure.

Reference will now be made to the exemplary embodiments illustrated, and specific language will be used herein to describe the same. It will nevertheless be understood that no limitation of the scope of the invention is thereby intended.

DETAILED DESCRIPTION

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result.

As used herein, "adjacent" refers to the proximity of two structures or elements. Particularly, elements that are identified as being "adjacent" may be either abutting or connected. Such elements may also be near or close to each other without necessarily contacting each other. The exact degree of proximity may in some cases depend on the specific context.

An initial overview of the inventive concepts are provided below and then specific examples are described in further detail later. This initial summary is intended to aid readers in understanding the examples more quickly, but is not intended to identify key features or essential features of the examples, nor is it intended to limit the scope of the claimed subject matter.

Although large ULE glass mirrors have been effectively utilized in high-precision, space-based optical applications, these mirrors are heavy and difficult to produce. The low stiffness-to-weight ratio of ULE glass material results in self-weight deflection in large ULE glass mirrors (e.g., primary mirrors in reflector telescope systems), which complicates alignment and testing on the ground. SiC, on the other hand has excellent mechanical properties, but cannot be polished to the necessary surface finish. A SiC mirror therefore requires a cladding material, such as amorphous elemental silicon, to provide an acceptable surface finish of the final mirror. In addition, some forms of SiC, such as sintered SiC commonly utilized in SiC mirrors, exhibit shrinkage (e.g., greater than 35%) in the manufacturing process, thus requiring over-processing and limiting the size of the mirror that can be produced. The materials currently used to meet the requirements of high-precision, space-based optical systems are expensive to manufacture and require long lead times to produce. A trade-off between weight, thermal expansion, and stiffness is often required to meet cost and schedule constraints.

Accordingly, an aerospace mirror and associated manufacturing methods are disclosed that provide a light-weight, high-stiffness, and low thermal expansion mirror with excellent optical properties, which can be manufactured at lower cost and on a shorter schedule than with legacy materials. The aerospace mirror can include a reaction bonded (RB) SiC mirror substrate, and a SiC cladding on the RB SiC mirror substrate forming an optical surface on the front side of the aerospace mirror.

A method for manufacturing an aerospace mirror can comprise obtaining a green mirror preform comprising porous carbon, SiC, or both, the green mirror preform defining a front side of the aerospace mirror and a back side of the aerospace mirror opposite the front side. The method can also comprise removing material from the green mirror preform to form support ribs on the back side. The method can further comprise infiltrating the green mirror preform with silicon to create a RB SiC mirror substrate from the green mirror preform. The method can still further comprise forming a mounting interface surface on the back side of the aerospace mirror from the RB SiC mirror substrate, and forming a reflector surface of the RB SiC mirror substrate on the front side of the aerospace mirror. Additionally, the method can comprise cladding the reflector surface of the RB SiC mirror substrate with SiC to form an optical surface of the aerospace mirror.

A method for preparing an optical surface of an aerospace mirror is also disclosed. The method can comprise obtaining an aerospace mirror having an optical surface on a front side and a mounting interface surface on a back side, the mounting interface surface being operable to mount or facilitating the mounting of the aerospace mirror to an external support structure in a final installation by coupling with a final installation mounting structure. The method can also comprise assembling the aerospace mirror to a test support base by coupling a test mounting structure to the mounting interface surface, wherein the test mounting structure is the same as, or equivalent to, or otherwise corresponds to, the final installation mounting structure. The method can further comprise measuring the optical surface (i.e., while attached to the test mounting structure). Additionally, the method can comprise machining the optical surface.

In addition, an aerospace mirror manufacturing assembly is disclosed. The assembly can comprise a test support base. The assembly can also comprise a test mounting structure. Additionally, the assembly can comprise an aerospace mirror mounted to the test support base via the test mounting structure. The aerospace mirror can have an optical surface on a front side and a mounting interface surface on a back side coupled to the test mounting structure. The mounting interface surface can be operable to mount the aerospace mirror to an external support structure in a final installation by coupling with a final installation mounting structure. The test mounting structure can be the same as, or equivalent to, or otherwise correspond to, the final installation mounting structure.

Figure 1B:
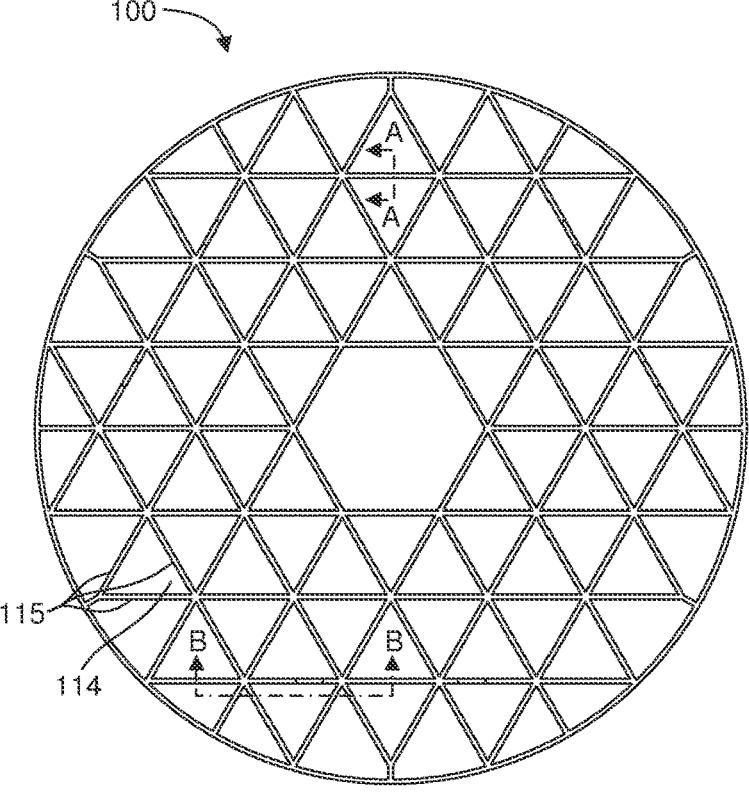
FIG. 1B illustrates a back view of the aerospace mirror of FIG. 1A, in accordance with an example of the present disclosure.
Figure 2:
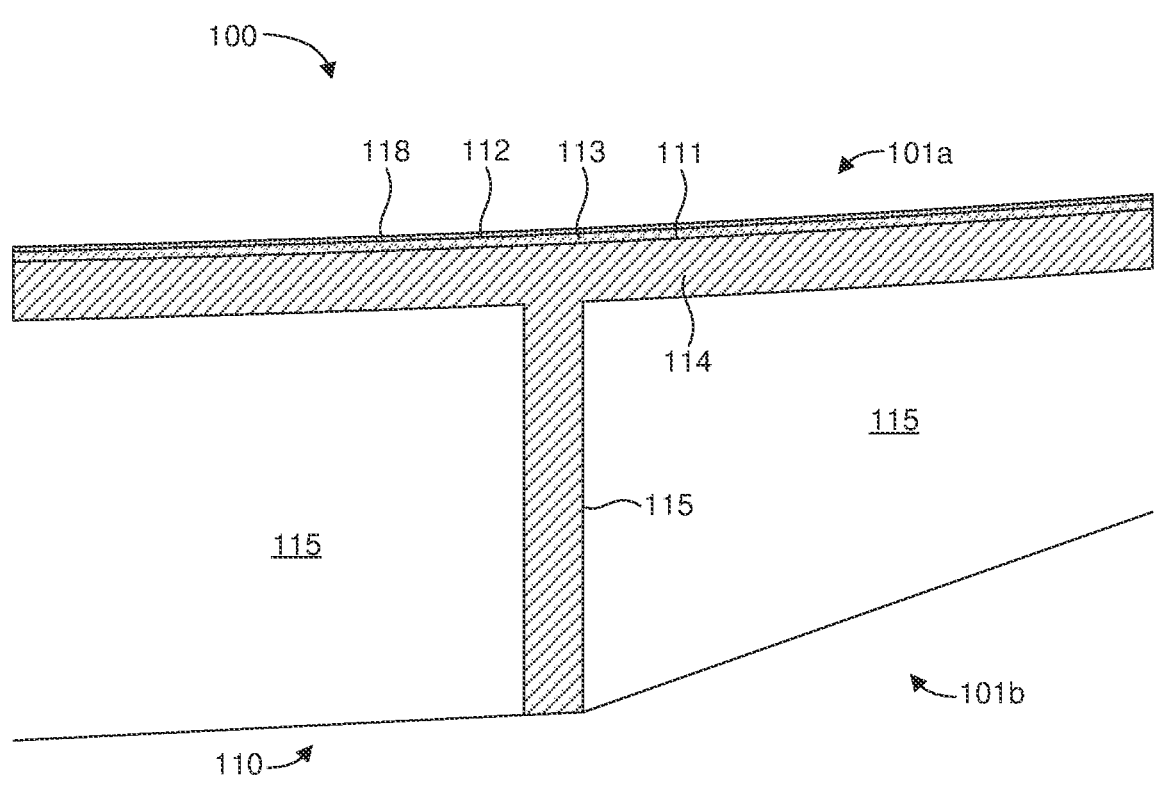
FIG. 2 is a detailed cross-sectional view of the aerospace mirror of FIG. 1A taken along line A-A, in accordance with an example of the present disclosure.
Figure 3:
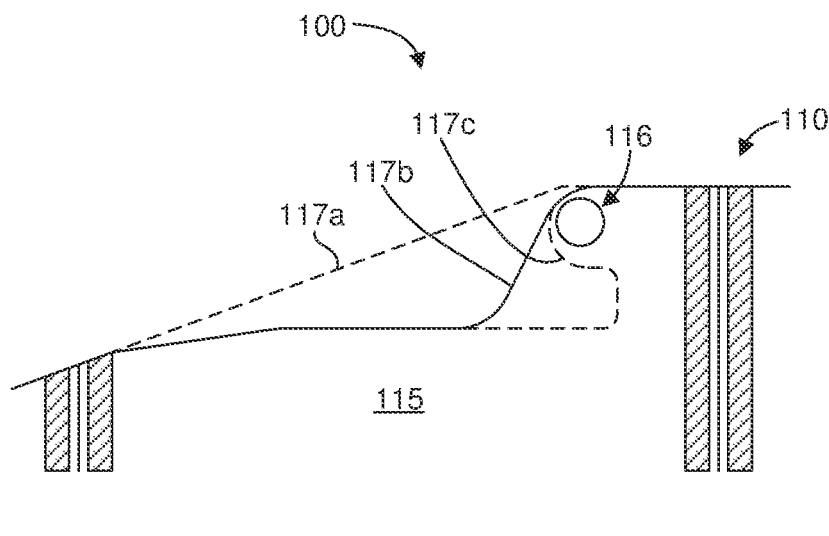
FIG. 3 is a detailed cross-sectional view showing a mounting interface surface of the aerospace mirror of FIG. 1A taken along line B-B, in accordance with an example of the present disclosure.

To further describe the present technology, examples are now provided with reference to the figures. With reference to FIGS. 1A and 1B, one embodiment of an aerospace mirror 100 is schematically illustrated in front and back views showing respective front (FIG. 1A) and back (FIG. 1B) sides of the mirror 100, which are opposite one another. Detailed cross-sectional views of the mirror 100 are shown in FIGS. 2 and 3. In some embodiments, the mirror 100 can be configured as a primary mirror in a reflective mirror system, which may be used in optical telescopes (e.g., high resolution imaging systems) and infrared sensors.

In general, the mirror 100 can include a mirror substrate and a reflective or optical surface on the front side of the mirror 100 disposed on or otherwise supported by the substrate. For example, as illustrated in cross-section in FIG. 2, a mirror substrate 110 can have a reflector surface 111 on a front side 101a of the mirror 100. An optical surface 112 can be formed on the reflector surface 111 of the substrate 110. The reflector surface 111 can provide the basic structure for the mirror's optical surface 112, which can be formed of a thin layer of material or cladding 113 disposed on the reflector surface 111, as discussed in more detail below. In some embodiments, the reflector surface 111 can form one side of a facesheet 114 of the mirror substrate 110.

The mirror substrate 110 can have any suitable configuration. In one aspect, the mirror substrate 110 can be configured to include weight-reduction structural features, such as support ribs 115 on the back side 101b of the mirror 100 (e.g., an "open back" configuration), which can provide support for the reflector surface 111 and optical surface 112 of the mirror 100. For example, as shown in FIG. 2, the ribs 115 can extend from the facesheet 114 to provide a structural backing for the reflector surface 111 and the mirror's optical or reflective surface 112. The ribs 115 can be in any suitable arrangement or configuration to provide adequate structural support for the mirror 100. As illustrated in FIG. 1B, the ribs 115 can be arranged in a triangular isogrid pattern, which can provide a lightweight and stiff substrate structure for the mirror's optical or reflective surface 112. However, other rib patterns may be utilized, and are contemplated herein.

The mirror 100 can also include one or more mounting interface surfaces (e.g., bond pads) on the back side 101b of the mirror 100 to mount the mirror 100 to an external support structure for the mirror 100, such as a satellite (e.g., via a mounting structure, such as a strut (not shown)). In one aspect, mounting interface surfaces can be formed in or on the mirror substrate 110. In the embodiment shown in FIG. 3, a mounting interface surface 116 (e.g., a bond pad) can be formed on a rib 115 of the substrate 110, for example, to facilitate bonding with an attachment fitting. Examples of such mounting interface surface and rib configurations are disclosed in United States Patent Application Publication No. 2017/0055731, which is incorporated herein by reference in its entirety. The rib 115 can have any suitable profile 117a-c, which may be configured to facilitate coupling with an attachment fitting (i.e., a mounting structure) and/or to reduce deformation due to the coupling with the attachment fitting. In other embodiments, a mounting interface surface 116 can define a cylindrical hole (not shown) at an intersection of the support ribs 115 on the back side 101b of the mirror. The cylindrical hole can be used to bond or screw a metal insert or fitting to the mirror 100 for attachment to an external support structure.

In one aspect, the mirror substrate 110 can comprise a reaction bonded (RB) silicon carbide (SiC) material. In another aspect, the optical surface 112 is formed from a SiC cladding 113 on the RB SiC mirror substrate 110. In particular, the SiC cladding 113 can comprise a chemical vapor deposition (CVD) SiC material. In some embodiments, the mirror 100 can include an optical coating 118 (e.g., a high-reflectivity, thin film coating) on the optical surface 112, as shown in FIG. 2.

Figure 4:
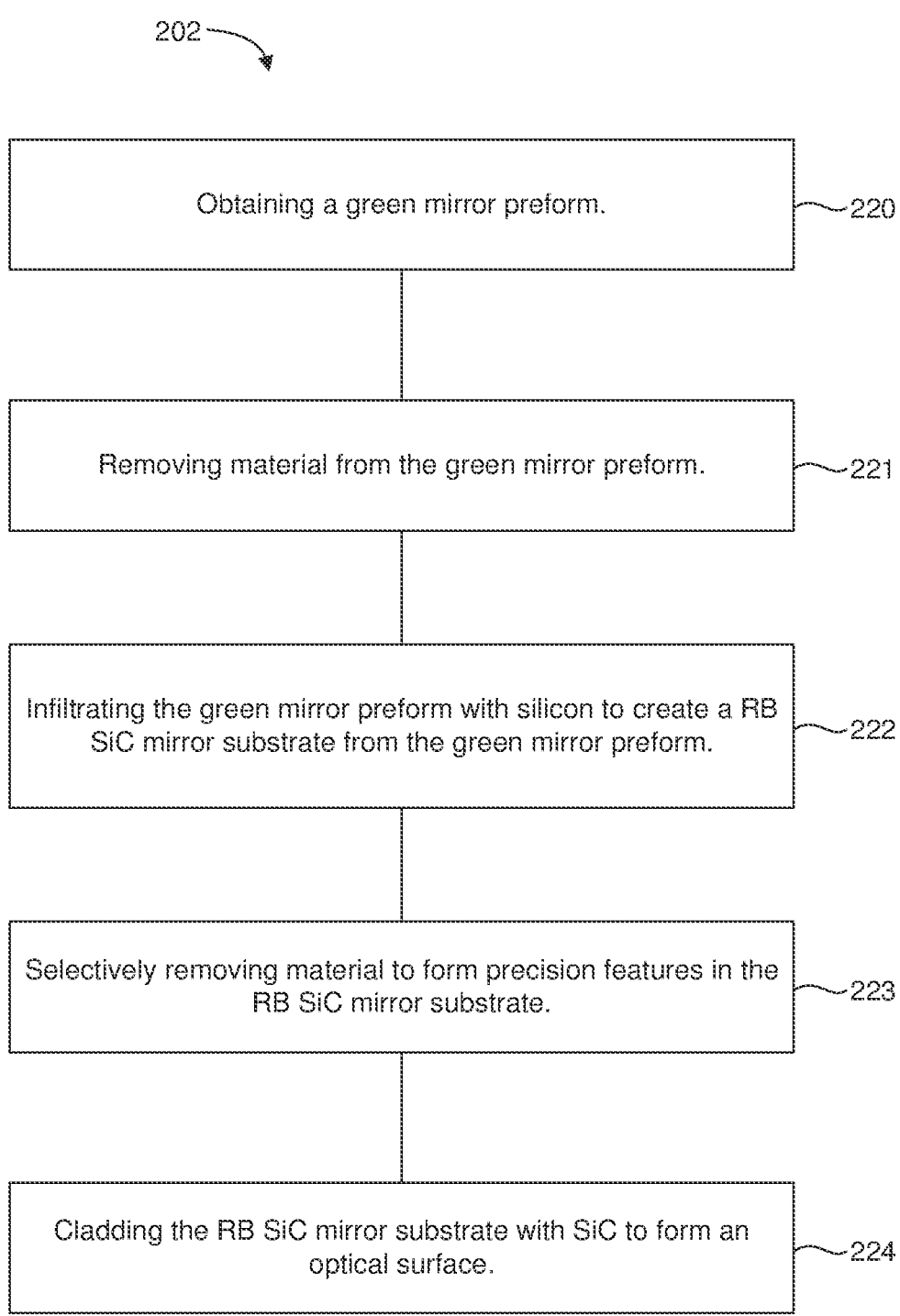
FIG. 4 illustrates a method for manufacturing an aerospace mirror in accordance with an example of the present disclosure.

A method 202 is outlined in FIG. 4 for manufacturing an aerospace mirror, such as the mirror 100 constructed of an RB SiC substrate 110 and a SiC cladding 113 for the optical surface 112. In general, the method comprises obtaining a green mirror preform 220, removing material from the green mirror preform 221, infiltrating the green mirror preform with silicon to create an RB SiC mirror substrate from the green mirror preform 222, selectively removing material to form precision features in the RB SiC mirror substrate 223, and cladding the RB SiC mirror substrate with SiC to form an optical surface 224.

The green mirror preform obtained at step 220 can comprise any material or combination of materials (e.g., porous carbon, SiC, plasticizers, fillers, etc.) suitable for reaction bonding by infiltration with silicon to form RB SiC material (e.g., comprising a SiC fraction of 70% and a Si filling of 30%, although other relative compositions are contemplated). The green mirror preform can be fabricated utilizing any suitable technique or process known in the art (e.g., made of a dried SiC and carbon slurry). RB SiC is a high specific stiffness, low thermal expansion material with excellent mechanical properties for an aerospace mirror. The green mirror preform can have any suitable shape or configuration and can be made or constructed by any suitable process known in the art. Typically, the green mirror preform will have a shape that corresponds to an outer boundary shape of the final mirror substrate. Thus, the green mirror preform can define the general shape of the mirror as well as the front and back sides of the mirror. The green mirror preform may be manufactured to rough tolerances and sized to exceed the final size of the mirror substrate sufficient to allow for material removal in the green state, shrinkage due to silicon infiltration and formation of RB SiC, and selective material removal in the "hardened" RB SiC state to form precision features. One advantage of RB SiC material is low shrinkage from the green state when compared to other types of SiC, such as sintered SiC.

Material can be removed from the green mirror preform at step 221 to form various features of the mirror substrate 110. For example, material can be removed from the green mirror preform to form support ribs 115 on the back side 101*b* of the mirror 100 (e.g., in an isogrid or other pattern) and to form a back side of the facesheet 114, which can reduce weight and areal density of the mirror 100. In some embodiments, the material can be removed from the front side 101*a* of the green mirror preform to form a reflector surface 111 of the mirror substrate 110. In other embodiments, the green mirror preform can be provided with a surface corresponding to the reflector surface 111 of the substrate 110 that can be formed into RB SiC without prior material removal in the green state. Material can be removed from the green mirror preform utilizing any suitable technique or process. One benefit of the green state material for RB SiC is the speed and ease in which it can be machined. Thus, typically, material will be removed from the green mirror preform by machining (e.g., milling). In some embodiments, high speed machining can be utilized. The ability to rapidly machine the material in the green state can significantly reduce the cost and schedule of producing a large, lightweight mirror blank from SiC by other methods, such as by casting to final dimensions.

Once material has been removed from the green mirror preform at step 221, the green mirror preform can be infiltrated 222 with silicon to create an RB SiC mirror substrate 110 from the green mirror preform. Reaction bonded silicon carbide is made by a chemical reaction between carbon or graphite with gaseous and/or molten silicon. Silicon infiltration to form reaction bonded SiC can be accomplished by any suitable technique or process known in the art, such as infiltration with silicon in a gaseous and/or molten state. The silicon reacts with the carbon to form silicon carbide (additional SiC if some was present in the preform). The reaction product bonds the silicon carbide particles. Any excess silicon fills the remaining pores in the body and produces a dense SiC—Si composite. Due to the left-over traces of silicon, reaction bonded silicon carbide is often referred to as siliconized silicon carbide.

With a mirror substrate 110 made of RB SiC, material can be selectively removed to form at step 223 small precision features and/or critical features in the mirror substrate 110 that meet dimensional, form, and/or surface finish requirements. For example, one or more mounting interface surfaces 116 (e.g., small bond pads) can be formed on the back side 101*b* of the mirror 100 from the RB SiC mirror substrate 110. In addition, the reflector surface 111 of the RB SiC mirror substrate 110 can be formed on the front side 101*a* of the mirror 100, which may be a precision and/or critical feature due to its impact on optical image quality. Material can be removed from the RB SiC mirror substrate 110 utilizing any suitable technique or process, such as machining (e.g., milling, lapping, grinding, etc.). Because RB SiC is a hard material that is difficult and time-consuming to machine, machining of the hardened SiC can be limited to only high-precision features (e.g., mounting interfaces and optical-related surfaces) that may not be accurately formed following green state machining and subsequent deformation (e.g., shrinkage, although minimal) due to reaction bonding of the silicon carbide. The amount of material removed during such fine machining of the hard SiC material can be minimized by the design of the green mirror preform and/or the location or amount of material removed from the green mirror preform prior to forming RB SiC. The strategic removal of material in the green state and in the hardened SiC state can provide a lightweight mirror with a low areal density while minimizing high-precision machining time on hard SiC.

Once the reflector surface of the RB SiC mirror substrate is in an acceptable condition, the mirror substrate can be clad at step 224 with SiC to form the optical surface 112 of the mirror 100. In some embodiments, the SiC cladding 113 can be applied or formed by a chemical vapor deposition (CVD) process (e.g., about 0.005 inches thick), a process in which volatile compounds containing carbon and silicon are reacted at high temperatures in the presence of hydrogen. Cladding the RB SiC mirror substrate 110 with CVD SiC can facilitate forming the optical surface 112 because CVD SiC material is easier to polish than RB SiC material. CVD SiC has a coefficient of thermal expansion close to that of RB SiC and, when applied only to the reflector surface 111 of the mirror substrate 110, can allow the optical form to be held over the operational temperature range. Compared to amorphous, elemental silicon as a cladding for optical surfaces, which is the industry standard, CVD SiC provides better surface quality and can be polished in less time. The combination of the RB SiC mirror substrate 110 and the CVD SiC cladding 113 for the optical surface 112 can provide a relatively low-cost, high-quality mirror.

In some embodiments, the SiC optical surface 112 can be subjected to grinding (e.g., loose abrasive grinding) and/or polishing (rough and/or fine polishing) operations to achieve a desired surface quality. An optical coating (e.g., a high-reflectivity, thin film coating) can then be applied or coated on the optical surface 112 as typical and known in the art for precision optics.

Figure 5:
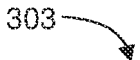
FIG. 5 illustrates a method for preparing an optical surface of an aerospace mirror in accordance with an example of the present disclosure.
Figure 5:
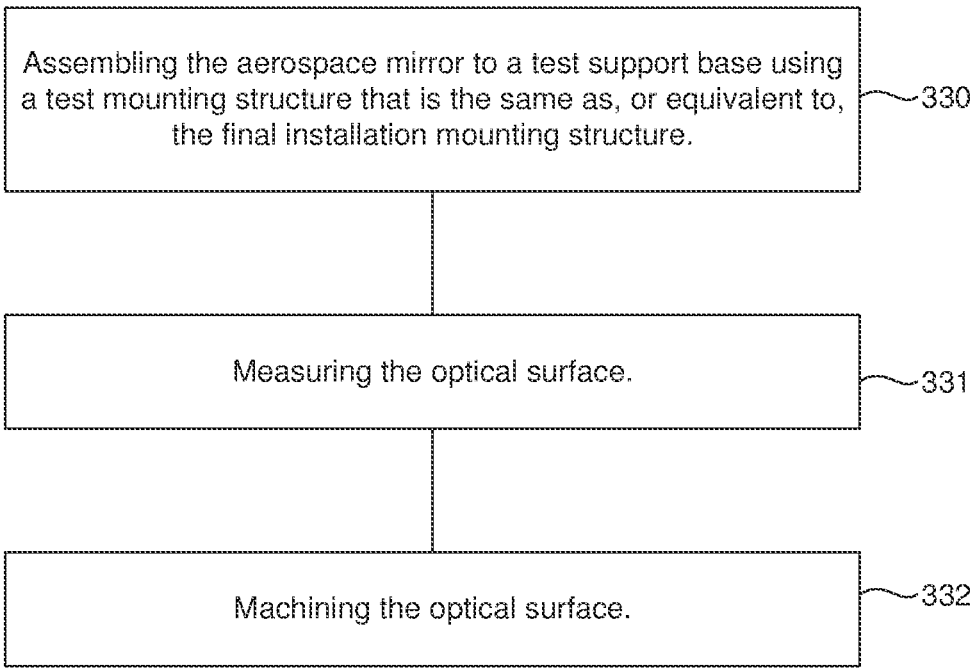

A method 303 for preparing an optical surface of an aerospace mirror (e.g., to achieve final dimensions, form, and/or surface finish) is outlined in FIG. 5. In general, the mirror 100 (e.g., RB SiC substrate 110 with CVD SiC cladding 113 as disclosed herein) has an optical surface 112 and one or more mounting interface surfaces 116 operable to mount the mirror 100 to an external support structure (e.g., a metering structure of a satellite) in a final installation by coupling with a final installation mounting structure (e.g., flight mounts or mounting struts). The method 303 can comprise assembling at step 330 the aerospace mirror 100 to a test support base using a test mounting structure that is the same as, or equivalent to, or that otherwise corresponds to the final installation mounting structure, measuring the optical surface 112 (e.g., for form error, surface roughness, surface quality, etc.) at step 331, and machining the optical surface 112 (e.g., milling, grinding, and/or polishing) at step 332. Measuring 331 the optical surface 112 and machining 332 the optical surface 112 can be repeated until the optical surface 112 is within a given tolerance.

Figures 6, 7:
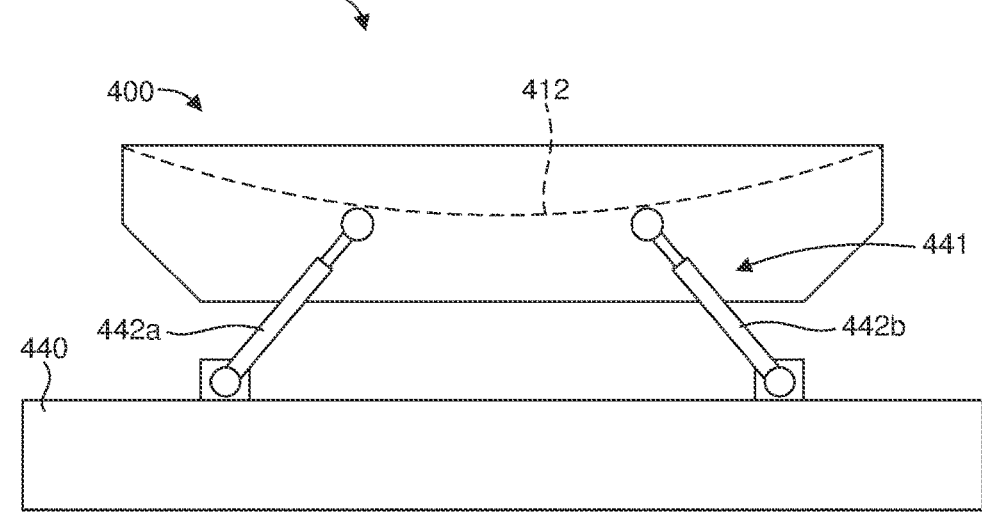
FIG. 6 illustrates a front view of an aerospace mirror manufacturing assembly in accordance with an example of the present disclosure.
FIG. 7 illustrates a side view of the aerospace mirror manufacturing assembly of FIG. 6, in accordance with an example of the present disclosure.
Figure 8:
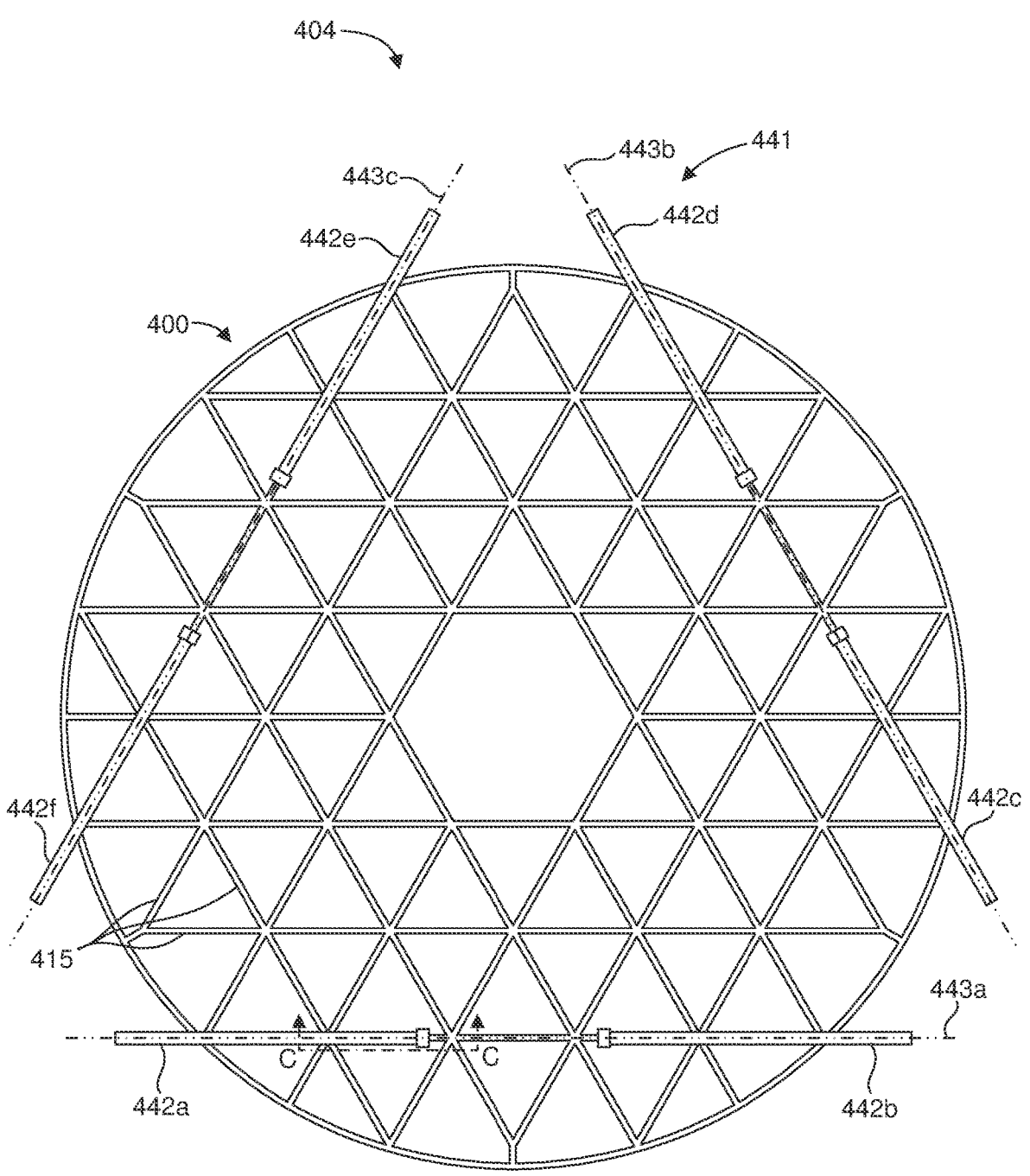
FIG. 8 illustrates a back view of the aerospace mirror manufacturing assembly of FIG. 6, in accordance with an example of the present disclosure.
Figure 9:
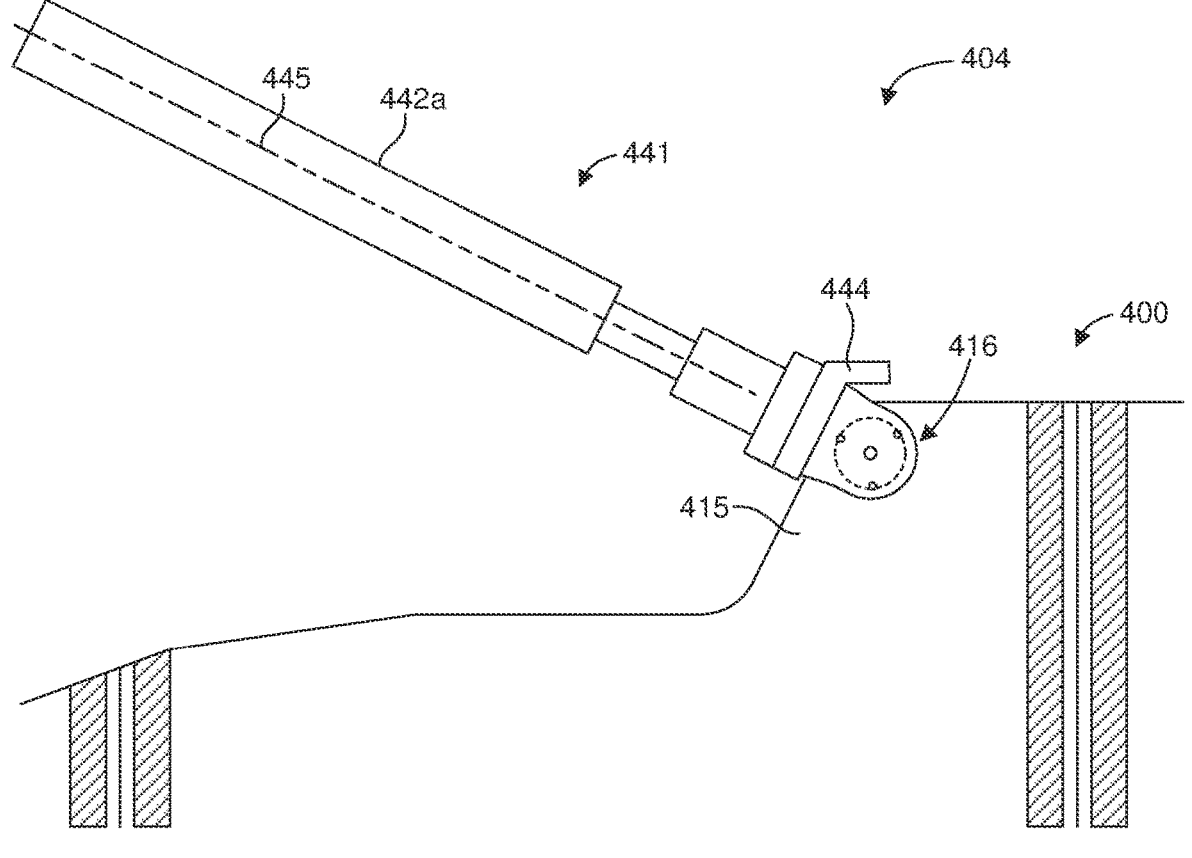
FIG. 9 is a detailed view of the aerospace mirror manufacturing assembly of FIG. 6 taken along line C-C, in accordance with an example of the present disclosure.

Aspects of an aerospace mirror manufacturing assembly 404 that can be used to prepare an optical surface 412 of an aerospace mirror 400 are illustrated in FIGS. 6-9. In particular, FIGS. 6-8 show schematic representations of front, side, and rear views, respectively, of the mirror manufacturing assembly 404, and FIG. 9 shows a detail view of the mirror 400 coupled to a mounting structure.

In addition to the aerospace mirror 400, the assembly 404 can include a test support base 440 and a test mounting structure 441 (e.g., mounting struts). The mirror 400 can be mounted to the test support base 440 via the test mounting structure 441 prior to final polish of the optical surface 412. The test mounting structure 441 is the same as, or equivalent to, or otherwise corresponds to the final installation mounting structure. In other words, the mirror 400 can be mounted on a test mounting structure 441 that mimics or is similar to the final mounting configuration so that the mirror 400 experiences the same or similar type and/or amount of deformation during the final stages of manufacture that it will experience in its final mounting configuration for use. Typically, mounting a mirror in its final (i.e., flight) mounting configuration (e.g., on a satellite) will induce significant wavefront error due to deformation of the mirror's optical surface, which may be due to mounting hardware misalignment and/or bonding errors resulting from bonding mounting hardware to the mirror. Mounting the mirror in a set-up that is the same or similar to the final mounting configuration causes this deformation to occur during manufacturing (e.g., prior to final polishing). As a result, the final material removal processes (e.g., final polishing) can account for the assembled deformation. In other words, the mirror can be in its final as-assembled configuration during the final stages of manufacture so that any deformation introduced in this configuration can be removed by subsequent material removal processes. Accordingly, the final mirror produced is within tolerance when actually mounted in its final (i.e., flight) configuration, such as on a satellite. This approach can therefore introduce fewer errors in the overall assembly error stack-up and prevent mounting and bonding error from being evident in the final optical surface.

The test mounting structure 441 can have any suitable configuration. In some embodiments, the test mounting structure 441 can comprise one or more struts 442a-f. Examples of such struts are disclosed in U.S. Patent Application Publication No. 2017/0055731 referred to above. In the test mounting structure 441 configuration, the number of struts 442, the angle/orientation of the struts 442 relative to the mirror 400 (e.g., to ribs 415), the length of the struts 442, etc. can be the same or configured to produce an equivalent effect on the mirror 400 as the final mounting structure. In some embodiments, one or more struts 442 can have an adjustable length along an axis 445 (FIG. 9) to facilitate adjusting a position of the mirror 400. In some embodiments, one or more struts 442 can have a negative coefficient of thermal expansion (CTE). Examples of such struts are disclosed in U.S. patent application Ser. No. 15/828,223 filed Nov. 30, 2017 and titled "Multi-Material Mirror System," which is incorporated herein by reference in its entirety.

In a particular embodiment, the struts 442a-f can be coupled to support ribs 415 of the mirror 400, as shown in FIG. 7. As illustrated, the struts 442a-f can be aligned with the ribs 415 to which they are attached to efficiently transfer loads between the mirror 400 and the test support base 440. In this case, six struts 442a-f are arranged in three sets or pairs (e.g., bi-pods), which are aligned with the ribs 415 or rib planes 443a-c oriented in three directions. In addition to the struts 442a-f, the test mounting structure 441 can include attachment fittings 444 (e.g., a clevis, see FIG. 9). The attachment fitting 444 can be bonded (e.g., with structural adhesive) or otherwise attached directly to the ribs 415 to which the struts 442a-f are aligned. Thus, the mirror 400 can have a mounting interface surface 416 (e.g., a bond pad) coupled to the test mounting structure 441.

With the struts 442a-f in-line with the ribs 415 or rib planes 443a-c, out-of-plane loads can be minimized or prevented from being imparted onto the ribs 415. Such a configuration can achieve an extremely efficient load transfer path from the strut mounts into the mirror 400 and can enable the mirror's optical form to be minimally affected by operational temperature changes, particularly when low CTE materials are utilized in the mounting structure (e.g., Invar® attachment fittings 444). This strut configuration can be identical or kinematically equivalent to a final mounting configuration for the mirror when installed, for example, on a satellite. The stiff RB SiC material of the mirror 400 and its lightweight design can facilitate the use of lightweight kinematic mounts, such as the struts 442a-f, which can minimize thermal sensitivity and self-weight deflection of the mirror 400.

In one aspect, the hardware used to mount the mirror 400 to the test mounting structure 441 can be the same hardware used to mount the mirror 400 in its final mounting configuration when installed. For example, the struts 442a-f used to mount the mirror 400 in the assembly 404 can also be used to mount the mirror 400 in its final flight mount configuration. In addition, the attachment fittings 444, which may be bonded to the mirror 400, can remain permanently attached to the mirror 400 even if different struts may be used in the final flight mount hardware.

With the mirror 400 mounted as in, or equivalent to, the final flight mount configuration in the assembly 404, the optical surface 412 can be measured by optical testing of the optical surface 412 (e.g., optical metrology to ascertain form error). Any suitable optical test or metrology technique can be utilized. In some embodiments, a rotational shearing optical metrology technique can be employed. Rotational shearing can provide high accuracy in determining the mirror's surface figure while reducing the influence of gravity in the flight mounting configuration, while also allowing use of a low-cost horizontal optical test. Thus, the optical metrology for the mirror 400 can be done using rotational shearing techniques to remove the influence of gravity while the mirror 400 is mounted in the assembly 404.

The optical surface 412 can be fine or finish machined while the mirror 400 is in the assembly 404 or, in other words, after mounting hardware has been attached to the mirror 400 (e.g., attachment fittings 444 have been bonded to the bond pads 416 and coupled to structural supports, such as the struts 442a-f) and the mirror 400 has been mounted to the test support base 440. The optical surface 412 can be finish machined utilizing any suitable process or technique, such as polishing, grinding, lapping, etc. In one aspect, the assembled mirror 400 can be polished using rotational shearing techniques to remove the influence of gravity while mounted on the structural supports. This can account for any mechanical influence of the structural supports on the optical form. In other words, any mechanical influence of the mounting structure 441 on the optical form can be accounted for in the manufacturing process and removed during final machining processes (e.g., polishing). The use of flight or flight-like mounts during manufacturing and optical testing can therefore remove at least one factor from the potential optical form error sources.

In one aspect, the CVD SiC cladding material can facilitate polishing the optical surface. For example, the CVD SiC cladding that forms the optical surface 412 is easier to polish than the RB SiC material that forms the mirror substrate 110 of FIGS. 1A, 1B, 2, and 3. The CVD SiC cladding 113 can enable the optical surface 412 to be polished to better than 5 angstroms of RMS surface roughness, with excellent optical form and control of the optical surface 412.

Once the optical surface 412 is in an acceptable condition, the optical surface 412 can then be coated with a suitable optical coating (e.g., a high-reflectivity thin film coating) as known in the art.

Reference was made to the examples illustrated in the drawings and specific language was used herein to describe the same. It will nevertheless be understood that no limitation of the scope of the technology is thereby intended. Alterations and further modifications of the features illustrated herein and additional applications of the examples as illustrated herein are to be considered within the scope of the description.

Although the disclosure may not expressly disclose that some embodiments or features described herein may be combined with other embodiments or features described herein, this disclosure should be read to describe any such combinations that would be practicable by one of ordinary skill in the art. The user of "or" in this disclosure should be understood to mean non-exclusive or, i.e., "and/or," unless otherwise indicated herein.

Furthermore, the described features, structures, or characteristics may be combined in any suitable manner in one or more examples. In the preceding description, numerous specific details were provided, such as examples of various configurations to provide a thorough understanding of examples of the described technology. It will be recognized, however, that the technology may be practiced without one or more of the specific details, or with other methods, components, devices, etc. In other instances, well-known structures or operations are not shown or described in detail to avoid obscuring aspects of the technology.

Although the subject matter has been described in language specific to structural features and/or operations, it is to be understood that the subject matter defined in the appended claims is not necessarily limited to the specific features and operations described above. Rather, the specific features and acts described above are disclosed as example forms of implementing the claims. Numerous modifications and alternative arrangements may be devised without departing from the spirit and scope of the described technology.

What is claimed is:

1. An aerospace mirror, comprising:
   a reaction bonded (RB) silicon carbide (SiC) mirror substrate; and
   a SiC cladding on the RB SiC mirror substrate forming an optical surface on a front side of the aerospace mirror;
   support ribs extending from a backside of the aerospace mirror, wherein the backside is on an opposite side the aerospace mirror from the front side;
   a mounting interface surface formed in one or more of the support ribs on the backside of the aerospace mirror; and
   a strut connected to the mounting interface surface such that the struts are in line with a plane of the rib to which it is connected.

2. The aerospace mirror of claim 1, wherein the SiC cladding comprises a chemical vapor deposition (CVD) SiC material.

3. The aerospace mirror of claim 1, wherein the RB SiC mirror substrate comprises a reflector surface on the front side operable to provide the optical surface.

4. The aerospace mirror of claim 3, wherein the RB SiC mirror substrate comprises a facesheet, wherein the reflector surface forms one side of the facesheet.

5. The aerospace mirror of claim 3, wherein the SiC cladding is disposed on the reflector surface.

6. The aerospace mirror of claim 1, wherein the ribs are arranged in a triangular isogrid pattern.

7. The aerospace mirror of claim 1, further comprising an optical coating on the optical surface.

8. A mirror system comprising:
   the aerospace mirror of claim 1; and
   an external support structure in support of the aerospace mirror.

* * * * *